United States Patent [19]

Shackford

[11] 3,943,441

[45] Mar. 9, 1976

[54] TAMPER-RESISTANT ELECTRICAL METER HOUSING

[75] Inventor: Ernest B. Shackford, Durham, N.H.

[73] Assignee: General Electric Company, Schenectady, N.Y.

[22] Filed: Jan. 22, 1975

[21] Appl. No.: 543,282

[52] U.S. Cl. ............... 324/110; 317/104; 317/107; 324/156
[51] Int. Cl.² ...................... G01R 1/04; H02B 9/00
[58] Field of Search ............ 324/110, 156; 317/104, 317/105, 106, 107, 108, 109, 110, 111; 220/284, 296, 298, 302; 215/302

[56] References Cited
UNITED STATES PATENTS

| | | | |
|---|---|---|---|
| 2,895,637 | 7/1959 | Bakke et al. | 317/107 |
| 3,846,677 | 11/1974 | Keever et al. | 317/107 |

Primary Examiner—R. V. Rolinec
Assistant Examiner—Ernest F. Karlsen
Attorney, Agent, or Firm—Vale P. Myles

[57] ABSTRACT

A tamper-resistant electrical meter housing includes an unbreakable cover assembly that cooperates with a matable base to enclose a meter device supportable on the base. The cover assembly includes an annular ring secured to the cover. A locking leaf spring is coupled to the cover assembly. The leaf spring is aligned to slide along the top of a rim portion of the base and snap into a recess to lock the cover assembly against rotation and removal. Once the cover assembly is locked to the base, the leaf spring is substantially concealed from view, so that an unauthorized person cannot effect removal of the cover to obtain access to the meter. The base also includes a specific area in alignment with the recess, which area is identifiable only by an authorized person. A hole may be drilled in this area by an authorized person and a tool may then be inserted through this hole to effect disengagement of the leaf spring and removal of the cover assembly from the base.

4 Claims, 10 Drawing Figures

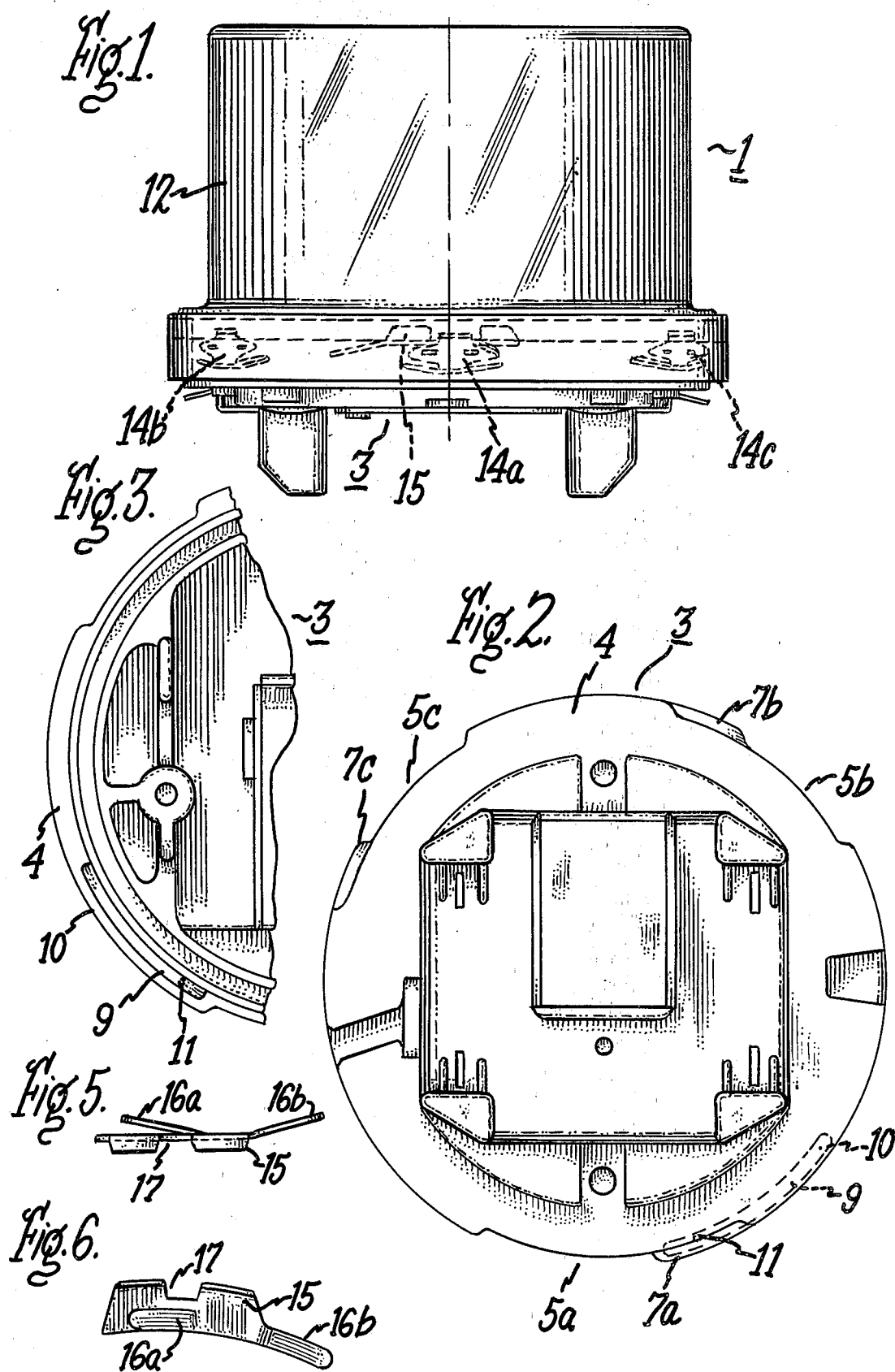

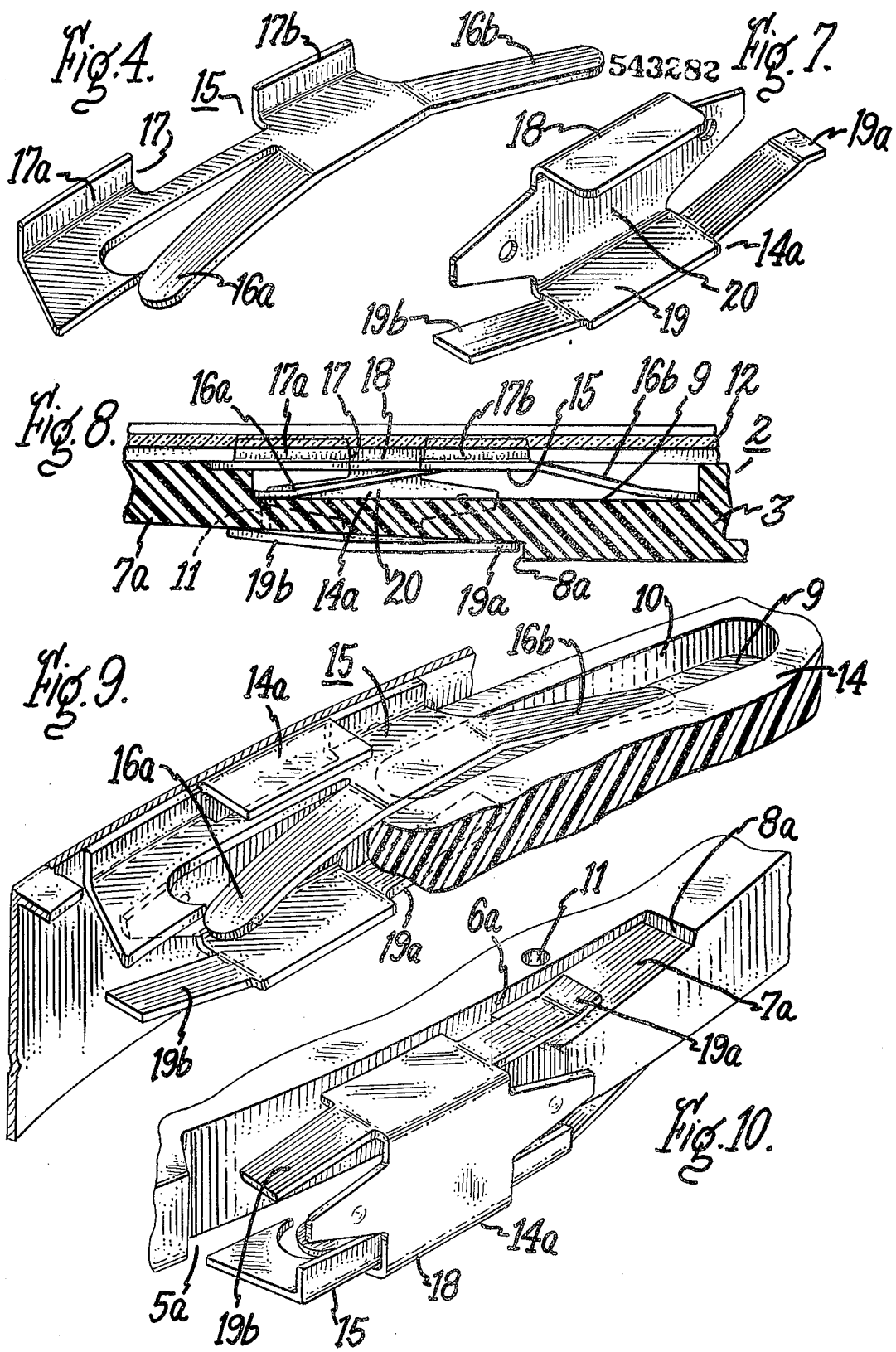

TAMPER-RESISTANT ELECTRICAL METER HOUSING

BACKGROUND OF THE INVENTION

This invention relates to a tamper-resistant electrical meter housing.

DESCRIPTION OF THE PRIOR ART

Electric utility companies have considerable difficulties with preventing unauthorized persons from tampering with their electrical meters. The most successful tampering by unauthorized persons has been accomplished by removing the cover of the meter and disconnecting the voltage coil so that the meter no longer operates to record power usage. Unauthorized persons have also removed the cover in order to either demesh the register, slow down the meter, or add drag to the rotor's magnetic bearing. Thus, electric utility companies have long desired a meter having a tamper-resistant unbreakable cover which is neither complicated in structure, nor expensive to manufacture.

Therefore, it is an object of this invention to provide a tamper-resistant meter that provides a positive lock against removal of the cover to obtain access to the meter.

Another object of this invention is to provide a tamper-resistant meter having a concealed locking means which prevents removal of the cover and access to the meter by unauthorized persons but still provides ready access by authorized personnel.

BRIEF DESCRIPTION OF THE DRAWINGS

FIG. 1 is an elevation view of a tamper-resistant electrical meter housing.

FIG. 2 is a bottom view of the base of the electrical meter housing of FIG. 1.

FIG. 3 is a partial broken away view of the top of the base of FIG. 2.

FIG. 4 is a perspective view of a locking leaf spring.

FIG. 5 is an elevation view of the leaf spring of FIG. 3.

FIG. 6 is a bottom view of the leaf spring of FIG. 4.

FIG. 7 is a perspective view of a cover ring clip.

FIG. 8 is a partial sectional view of the cover assembly, cover ring clip, leaf spring and base.

FIG. 9 is an enlarged top perspective view of the leaf spring engaging the cover ring clip and entering the base recess.

FIG. 10 is a bottom perspective view of the elements shown in FIG. 9.

SUMMARY OF THE INVENTION

A tamper-resistant electrical meter includes an unbreakable cover assembly that cooperates with a matable base to enclose a meter supportable on the base. The base has a rim portion which rim includes a plurality of circumferentially spaced first recesses, a plurality of circumferentially spaced guiding means adjacent the first recesses, and a second recess positioned on a top surface of the rim spaced from the first recesses. The cover assembly includes an annular ring secured to the cover. The ring includes a plurality of circumferentially spaced clip means. A locking leaf spring is coupled to the cover assembly. The clip means are aligned to enter the first recesses and move in sliding engagement with the guiding means to mate the base with the cover assembly upon relative movement of the base and the cover assembly. The leaf spring is aligned to snap into the second recess and engage the second recess in spring biased tension to lock the cover assembly. The locking leaf spring is colored to match the color of the base to substantially conceal the spring from view in the normal usage of the meter. Reverse rotation of the cover by an unauthorized person to effect removal is prevented by the engagement of the locking leaf spring with the second recess.

Because the leaf spring is substantially concealed from view in the normal positioning of the meter, an authorized person cannot determine how to effect release of the locking leaf spring in order to rotate the cover to effect removal of the cover and obtain access to the meter. However, the base further includes an area in alignment with the second recess for effecting access to the leaf spring, whereby the authorized person can release the locking spring and remove the cover to obtain access to the meter.

DESCRIPTION OF THE PREFERRED EMBODIMENT

Referring to FIGS. 1 and 2 of the drawing, an electrical meter housing 1 comprises a cup-shaped rotatable cover assembly 2 which cooperates with a base 3 to define an enclosure within which a meter (not shown) may be mounted. Base 3 is formed to include a rim 4 (see FIG. 2) at its outer circumference. Rim 4 in turn includes a plurality of circumferentially spaced first recesses 5a, b, c extending through the thickness of rim 4. FIGS. 9 and 10 are illustrative of the construction of that portion of the base adjacent a first recess. That portion of base rim 4 includes a guiding means 6a formed on the bottom surface of rim 4, the guiding means being adjacent corresponding first recess 5a. Guiding means 6a has an inclined segment 7a adjacent corresponding first recess 5a, and a shoulder 8a adjacent the end of the guiding means 6a. Rim 4 also includes a second recess 9, as illustrated in FIGS. 3 and 9 formed on the top surface of rim 4 and spaced from first recess 5a. The recess 9 extends only partially through the rim 4 and includes wall 10.

As shown in FIGS. 2 and 3, base 3 still further includes an area 11 which is identifiable only by an authorized person. The area 11 is in alignment with second recess 9 and is marked or identified in a suitable manner to indicate to the authorized person a specific area where a small hole may be drilled to receive a suitable tool, such as a screwdriver or small rod.

As best illustrated by FIG. 1, cover assembly 2 comprises a cover 12 preferably formed from a strong, breakage-resistant material such as a polycarbonate, for example that sold under the trademark "Lexan". It further comprises a ring 13 secured to cover 12. In its assembled position on the base 3 the ring 13 completely surrounds an outer circumferential surface portion of rim 4. Ring 13 is preferably constructed of a metal such as stainless steel.

Ring 13 includes three circumferentially spaced clip means 14a, b, c each adapted to be received in one of corresponding recesses 5a, b, c. A locking leaf spring 15 is coupled to cover assembly 2 and is adapted to be received in recess 9. Clip means 14a, b, c and spring 15 may be made of a metal such as stainless steel. The clip means 14a, b, c are fastened to ring 13 in any conventional manner, such as by spot welding. Clip means 14a is typical of the clip means used in the invention. As best illustrated in FIG. 7, a clip means 14a includes a flange 20, which is spot welded or otherwise suitably secured to the ring 13 for mounting the clip means in properly spaced relationship on the ring. It also includes another flange 18, later described. The clip means 14a includes upwardly inclined resilient arms 19a, b for engaging inclined segment 7a of the corresponding guiding means 6a.

In the form shown, as best illustrated in FIGS. 4, 5, and 6, spring 15 includes a notch 17 which secures the spring 15 to clip means 14a. Segments 17a, b are adapted to pass into the space between cover 12 and ring 13 and to engage flange 18 of clip means 14a. Spring 15 also includes tension arms 16a, b, inclined in a direction toward base 3. These arms are adapted to enter second recess 9 and engage wall 10 thereof.

Clip means 14a, b, c are so positioned on the ring 13 so as to be alignable with recesses 5a, b, c to facilitate mounting of the cover assembly on the base 3 to enclose the meter. The locking spring 15 is positioned on the ring in proper relationship to be received in the recess 9 when the cover assembly is in its assembled position. Segments 17a, b extend into a space between the ring 13 and cover 12 and engage clip 14a on both sides of flange 18. When the meter is assembled, clip means 14a and locking spring 15 are inaccessible and are substantially concealed from view.

FIGS. 9 and 10 illustrate the operation for assembling the cover assembly 2 on the base 3. For enclosing the meter the cover assembly is placed over the base with the clip means 14a in alignment with the recesses 5a. Clip means 14b, c are similarly aligned with corresponding first recesses 5b, c. The cover assembly 2 (only partially shown by a portion of ring 13) is then turned in a clockwise direction (as viewed from the top). This causes inclined resilient arm 19a of the clip means to engage the inclined segment 7a of the corresponding guiding means 6a. As the turning of the cover assembly continues the arms 19a, b ride along the inclined segment 7a to provide increasing pressure holding the cover assembly 2 in firm engagement with the base 3. Turning movement is limited by engagement of the end of arm 19a with the corresponding shoulder 8a. Clip means 14b, c cooperate with their corresponding guiding means, inclined segments and shoulders in the same manner as 14a.

During this turning movement the tension arms 16a, b of the locking leaf spring 15 ride in tension along the top surface of the rim 4. At the time the end of the arm 19a engages the corresponding shoulder 8a, the tension arms 16a, b of the spring 15 are in alignment with the recess 9. The tension in segment 16 causes the tension arms 16a, b to spring into the recess 9, engaging the wall 10 and preventing clockwise and counterclockwise movement of the cover assembly. This locks the cover assembly in position as illustrated in FIG. 8 prevents unauthorized removal of the cover assembly and unauthorized access to the meter. Moreover, in the normal mounted position of the electrical meter the locking leaf spring is substantially concealed from view and color camouflaged to match the color of the base. As a result, an unauthorized person is unable to determine how the cover assembly is locked to the base. Any effort by such unauthorized person to obtain access to the meter without breaking the cover is frustrated.

On the other hand, access to the meter may be easily obtained by an authorized person, for example, for the purpose of testing or repairing the meter. Such authorized person may readily identify the area 11 from a relatively inconspicuous marking on the bottom of the base or from instructions available to him identifying the location of area 11 relative to visually identifiable parts of the base. This area being in line with the locking spring 15, it is only necessary for the authorized person to drill a small hole through the base in the area 11. A suitable tool, such as a small screwdriver or a small rod, may then be inserted through the drilled opening to raise the tension arm 16a of the spring 15 above the level of the top of rim 4. This permits counterclockwise rotation of the cover assembly 2 to effect separation of the cover assembly 2 from the base 3 and access to the meter.

After the testing or repairing of the meter has been effected the authorized person may seal the small drilled opening with a suitable filler material, such as epoxy, matching the texture and color of the base so as to effectively conceal any special significance of area 11 from unauthorized persons.

In the foregoing description of the preferred embodiment, the base mates with the cover assembly upon relative turning movement of the base and the cover assembly. To mate the base and the cover assembly, clip means 14a, b, c are aligned to enter first recesses 5a, b, c and move in sliding engagement with guiding means 6a, b, c. This particular mating means is advantageous because it is simple and easy to manufacture. However, those skilled in the art will appreciate that other means are available for mating the base and cover assembly. For example, the base and cover assembly may be mated upon a relative turning movement by properly threading the peripheral surface of the base and the interior surface of the cover ring.

While a specific embodiment of this invention has been shown and described the invention is not limited to the particular construction shown and described and it is intended by the appended claims to cover all modifications coming within the spirit and scope of the claims.

What is claimed as new and which it is desired to secure by Letters Patent of the United States is:

1. A tamper-resistant electrical meter housing including a rotatable cover assembly cooperable with a matable base to enclose a meter supportable on the base wherein:
   a. said base includes a rim having a recess positioned on a top surface of said rim;
   b. said cover assembly includes a cover and a ring secured to said cover;
   c. means for mating said base with said cover assembly upon relative turning movement of said base and said cover assembly;
   d. a concealed locking means coupled to said cover assembly and receivable in said recess to prevent turning movement of said cover assembly relative to said base, thereby preventing unauthorized removal of said cover assembly from said base.

2. The tamper-resistant meter housing as recited in claim 1, wherein said base includes
   a. an area identifiable to an authorized person, said area being in alignment with said recess, said area being drillable by an authorized person to permit insertion therethrough of a suitable tool for releasing said concealed locking means to effect removal of said cover assembly from said base.

3. The tamper-resistant meter housing as recited in claim 1, wherein:

a. said concealed locking means comprises a leaf spring, said spring including a segment inclined in a direction toward said base, said inclined segment riding on the top surface of said rim during relative turning movement of said cover assembly and said base, said leaf spring being movable into alignment with said recess to permit said segment to spring into said recess and engage a wall of said recess to prevent turning movement.

4. A tamper-resistant electrical meter housing including a rotatable cover assembly cooperable with a matable base to enclose a meter supportable on the base, wherein:
   a. said base includes a rim having a plurality of circumferentially spaced first recesses extending through said rim;
   b. said rim further includes a plurality of circumferentially spaced guiding means on a bottom surface thereof adjacent said first recesses and a second recess positioned on a top surface of said rim and spaced from said first recesses;
   c. said cover assembly includes a cover and a ring secured to said cover;
   d. said ring includes a plurality of circumferentially spaced clip means aligned to enter said first recesses and to engage said guiding means, upon relative turning movement of said base and said cover assembly, said guiding means limiting such relative turning movement;
   e. a concealed locking means coupled to said cover assembly and, receivable in said second recess to prevent movement of said cover assembly relative to said base, thereby preventing unauthorized removal of said cover assembly from said base.

* * * * *